(12) United States Patent
Münzer et al.

(10) Patent No.: US 7,212,063 B2
(45) Date of Patent: May 1, 2007

(54) HALF-BRIDGE CIRCUIT WITH PHASE OUTPUT

(75) Inventors: Mark Nils Münzer, Soest (DE); Roman Lennart Tschirbs, Soest (DE)

(73) Assignee: Eupec Europaische Gesellschaft fur Leistungshalbleiter mbH Max-Planck-Str. 5, Warstein (DE)

( * ) Notice: Subject to any disclaimer, the term of this patent is extended or adjusted under 35 U.S.C. 154(b) by 0 days.

(21) Appl. No.: 10/978,930

(22) Filed: Nov. 1, 2004

(65) Prior Publication Data

US 2005/0077947 A1    Apr. 14, 2005

Related U.S. Application Data

(63) Continuation of application No. PCT/EP03/04096, filed on Apr. 17, 2003.

(30) Foreign Application Priority Data

May 2, 2002    (DE)    ............... 102 19 760

(51) Int. Cl.
*H03K 17/56*    (2006.01)

(52) U.S. Cl. ...................... 327/419; 327/433

(58) Field of Classification Search ........... 327/419, 327/432, 433
See application file for complete search history.

(56) References Cited

U.S. PATENT DOCUMENTS

| | | | | |
|---|---|---|---|---|
| 4,493,017 | A | 1/1985 | Kammiller et al. | 363/132 |
| 5,929,519 | A | 7/1999 | Mori et al. | 257/724 |
| 6,137,703 | A * | 10/2000 | Julian et al. | 363/127 |
| 6,297,971 | B1 * | 10/2001 | Meiners | 363/36 |
| 6,407,937 | B2 * | 6/2002 | Bruckmann et al. | 363/56.05 |

FOREIGN PATENT DOCUMENTS

| | | |
|---|---|---|
| DE | 694 31 128 T2 | 2/2003 |
| EP | 0 278 432 A1 | 2/1988 |
| EP | 0 621 635 A1 | 4/1994 |

* cited by examiner

*Primary Examiner*—Kenneth B. Wells
(74) *Attorney, Agent, or Firm*—Baker Botts L.L.P.

(57) ABSTRACT

A half-bridge circuit, in which an input signal that is applied between two input terminals can be picked up at a phase output comprises two switching transistors controlled by a respective control signal that is applied between a control electrode and an auxiliary electrode and two diodes. The first input terminal is connected to the first electrode of the first switching transistor and to the first diode's cathode. A second electrode of the first switching transistor is connected to the first diode's anode by means of the phase output, via a line, to a first electrode of the second switching transistor and to a cathode of the second diode. A second electrode of the second switching transistor is connected to an anode of the second diode and to the second input terminal. The auxiliary electrode of the first switching transistor is connected to the line of the phase output.

11 Claims, 3 Drawing Sheets

HALF-BRIDGE CIRCUIT WITH PHASE OUTPUT

CROSS REFERENCE TO RELATED APPLICATION

This application is a continuation of copending International Application No. PCT/EP03/04096 filed Apr. 17, 2003 which designates the United States, and claims priority to German application no. 102 19 760.1 filed May 2, 2002.

TECHNICAL FIELD OF THE INVENTION

The present invention relates to a half-bridge circuit.

BACKGROUND OF THE INVENTION

Half-bridge circuits are used quite generally to generate an AC signal from a DC voltage that is supplied on the input side. When connected up in an appropriate manner, half-bridge circuits of this type may also be used to generate polyphase AC signals, in particular also three-phase current signals. The output-side (if appropriate polyphase) AC signal is then supplied to a motor, for example.

A multiplicity of variations of half-bridge circuits are known in accordance with the prior art. Half-bridge circuits on which the invention is based are essentially based on two power transistors and two diodes which are usually respectively integrated on a single chip. In this case, the power transistors used are preferably so-called insulated gate bipolar transistors (IGBTs) on account of their low control powers and their small forward resistances on the collector-emitter path. Field effect power transistors, preferably MOSFETs, are also used for relatively low powers.

In this case, the forward current paths, i.e. the source-drain paths or collector-emitter paths, of the power transistors are connected in series on the input side. When the polarity is reversed, a respective diode is connected in parallel with the two power transistors in this case. In concrete terms, this means that, when using npn IGBTs, the collector electrode of an IGBT is respectively connected to the corresponding anode of the parallel-connected diode and the emitter electrode of the IGBT is connected to the cathode of the corresponding parallel-connected diode. The phase output, at which the AC voltage can be tapped off, is located at the node between the two series-connected power transistors.

In the event of a short circuit, it is desirable to negatively feed back the drive signal of the power transistors as much as possible in order to limit the turn-off speed. In the case of normal operation, however, too much negative feedback is associated with increased losses, which is undesirable.

In order to generate such negative feedback of the drive signal, in accordance with the prior art, said drive signal is therefore not applied directly to the corresponding control inputs (in particular the gate and source or the gate and emitter in the abovementioned embodiment variants) of the discrete power transistors (initially assumed to be ideal) but rather is applied via respective inductances arranged in the forward current paths of the two power transistors. The control inputs which are arranged in the forward current paths downstream of the inductances are generally referred to as auxiliary electrodes, i.e., for example, as the auxiliary source electrode or auxiliary emitter. In accordance with the prior art regarding inductive negative feedback the values selected for the inductances represent a compromise between limiting switching losses during normal operation and limiting the turnoff speed of the corresponding power (switching) transistor in the event of a short circuit.

In practice, use is made of the fact that, in the half-bridge circuit described above, each line section, i.e. each conductor track and each connection realized with the aid of bonding wires or the like, between the individual discrete components (initially assumed to be ideal), namely the power transistors and the diodes, represents a (line/leakage) inductance, it being possible to predetermine the magnitude of each of these inductances within a wide range, if appropriate with regard to the concrete application. Arranging the corresponding (auxiliary) electrodes (for example the auxiliary source electrode or auxiliary emitter) in a suitable manner in the respective line sections that lead away from the electrodes (for example the source or emitter) thus makes it possible to establish the magnitude of the inductances that are required for the negative feedback and the level of the respective negative feedback.

In order to elucidate the facts specified above, reference is made by way of example to a concrete embodiment of a half-bridge circuit (in accordance with the prior art) outlined in FIG. 3 of the drawings.

FIG. 3 shows an equivalent circuit diagram of a half-bridge circuit (in accordance with the prior art) based on two IGBTs and two diodes. In this case, in addition to the circuit symbols symbolizing these (ideal) components, the equivalent circuit diagram also reveals the (parasitic) leakage and/or line inductances that are implicitly or intentionally present in each lead and are identified by corresponding discrete circuit symbols.

The half-bridge circuit shown in FIG. 3 has two input terminals 15 and 16—via which an input DC voltage $V_E$ can be supplied—and a phase output P, at which the AC voltage generated can be tapped off. This phase output P represents, for example, a phase of a three-phase network.

The first input terminal 15 is connected to the node 7 via the (leakage) inductance L14. The node 7 is connected, on the one hand, to the collector C1 of the first insulated gate bipolar transistor 1 via the (leakage) inductance L12 and, on the other hand, to the cathode K1 of the first diode D1 via the (leakage) inductance L13. The emitter E1 of the first insulated gate bipolar transistor 1 is led to the node 8. Furthermore, the anode A1 of the diode D1 is connected to the node 9 and the latter is in turn connected to the node 8 via the (leakage) inductance L11. The node 8 is in turn led to the node 10 via the (leakage) inductance L24. In accordance with the prior art, this node 10 forms, on the one hand, the terminal point for the phase output P, the (line/leakage) inductances of which are symbolized, in the figure of the drawing in question, by corresponding circuit symbols identified by the reference symbols L15 and L16, and, on the other hand, the terminal point for the second series-connected power/switching transistor (IGBT 2).

Taking into account line and/or leakage inductances, the node 10 establishes a connection, on the one hand, to the collector terminal C2 of the second insulated gate bipolar transistor 2 via the (leakage) inductance L22 and, on the other hand, to the cathode K2 of the second diode D2 via the (leakage) inductance L23. The emitter E2 of the second insulated gate bipolar transistor 2 is led to the node 11. The anode A2 of the second diode D2 is likewise connected to the node 11 via the (leakage) inductance L21. A line that is represented by the inductance L27 in turn leads away from the node 11 to the node 12 and from there onward to the input terminal 16.

In order to obtain the abovementioned desired negative feedback, the drive signals for the two insulated gate bipolar transistors 1, 2 are not switched directly between the respective control terminals gate G1 and G2 and emitter E1 and E2 of the insulated gate bipolar transistors 1 and 2 but rather the drive signals are injected further away from these control terminals gate G1 and G2 and emitter E1 and E2 on the existing connection paths between the emitter E1 of the first insulated gate bipolar transistor 1 and the collector C2 of the second insulated gate bipolar transistor 2 and between the emitter E2 of the second insulated gate bipolar transistor 2 and the input terminal 16. The corresponding terminal points which are also referred to as auxiliary emitters in the jargon are identified by the reference symbols HE1 (auxiliary emitter of the IGBT 1) and HE2 (auxiliary emitter of the IGBT 2) in FIG. 3. Accordingly, the auxiliary emitter HE1 of the first insulated gate bipolar transistor 1 is situated directly at the node 10 to which the phase output P is connected and the auxiliary emitter HE2 of the second insulated gate bipolar transistor 2 is situated at the node 12 that in turn establishes a connection to the input terminal 16.

FIG. 3 shows the commutation of a DC voltage $V_E$ (which is supplied on the input side) during normal operation of the half-bridge circuit. Accordingly, when the first insulated gate bipolar transistor 1 is turned on, a current flows along the current path (identified by the reference symbol 13 in the figure of the drawing) to the phase output P on account of the positive voltage + applied to the first input terminal 15: in accordance with FIG. 3, the current path runs to the phase output P via the inductance L14, the node 7, the inductance L12, the collector-emitter path C1-E1 of the insulated gate bipolar transistor 1, the node 8, the inductance L24 and the node 10.

In accordance with Lenz's law, when the first insulated gate bipolar transistor 1 is turned off, the current flowing to the phase output P will initially continue to flow. However, since the current path 13 to the positive terminal 15 has been interrupted by the turned-off IGBT 1, the current commutates to the current path identified by the reference symbol 14. Accordingly, when the first insulated gate bipolar transistor 1 is off, the second input terminal 16 (negative voltage pole–of the input DC voltage $V_E$) is connected to the phase output P via the node 12, the inductance L27, the node 11, the inductance L21, the diode D2 connected in the forward direction, the inductance L23 and the node 10.

During the normal commutation process, the current intensity in the negative feedback inductances L24 and L27 therefore changes. Negative feedback that is associated with undesirable switching losses therefore takes place.

The same applies to the case of a phase short circuit. Assume, by way of example, that there is a short circuit between the phase output P and the second input terminal 16. In this case, when the IGBT 1 is turned on, a current will flow from the positive input terminal 15 to the negative input terminal 16 via the inductance L14, the node 7, the inductance L12, the collector-emitter path C1-E1 of the IGBT 1, the inductance L24, the node 10, the inductance L15 and the short-circuit path.

When the first insulated gate bipolar transistor 1 is turned off, the current intensity in the inductance L24 changes. The negative feedback that is desired in this case in order to limit the turn-off speed of the first insulated gate bipolar transistor 1 therefore takes place.

Although the abovementioned embodiment has fundamentally proven successful, the negative feedback of the driving of the two switching transistors that is needed to limit the turn-off speed of the latter in the event of a short circuit leads to switching losses during normal operation of the half-bridge circuit.

SUMMARY OF THE INVENTION

The invention is therefore based on the object of configuring and developing a half-bridge circuit that is known per se in such a manner that switching losses are reduced further during normal operation of the half-bridge circuit without dispensing with limitation of the turn-off speed of the switching transistors in the event of a phase short circuit.

In the case of a half-bridge circuit of the generic type, this object can be achieved by a half-bridge circuit, in which an input signal that is applied between two input terminals can be tapped off at a phase output, comprising two switching transistors which can be driven via a respective drive signal that is applied between a control electrode and an auxiliary electrode, and two diodes, wherein the first input terminal being connected to a first electrode of the first switching transistor and to a cathode of the first diode, a second electrode of the first switching transistor being connected to an anode of the first diode, to the phase output via a line, to a first electrode of the second switching transistor and to a cathode of the second diode, a second electrode of the second switching transistor being connected to an anode of the second diode and to the second input terminal, and wherein the auxiliary electrode of the first switching transistor is connected to the line to the phase output.

The object can also be achieved by a half-bridge circuit comprising a first and second input terminals and a phase output, a first diode comprising a cathode and an anode, a second diode comprising a cathode and an anode, a first switching transistor drivable through a control electrode and an auxiliary electrode coupled with a line to the phase output, and comprising a first electrode coupled with the first input terminal and the cathode of the first diode, and a second electrode coupled to the anode of the first diode and with the phase output via the line; and a second switching transistor comprising a first electrode coupled with the second electrode of the first switching transistor and with the cathode of the second diode, and a second electrode coupled with the anode of the second diode and with the second input terminal.

The auxiliary electrode of the first switching transistor can be connected to the line to the phase output at a distance from the second electrode of the first switching transistor at which the value of a inductance located in the connection path between the second electrode of the first switching transistor and the auxiliary electrode of the first switching transistor corresponds precisely to that value which is required for predetermined limitation of the turn-off speed of the first switching transistor by means of inductive negative feedback. The inductance can be a line inductance and/or a leakage inductance. The line to the phase output can be connected essentially directly to the second electrode of the first switching transistor. The anode of the first diode can be directly connected to the auxiliary electrode of the first switching transistor. The two switching transistors can be insulated gate bipolar transistors. The insulated gate bipolar transistors can be of the npn type, and the first electrodes of the insulated gate bipolar transistors can be the collector electrodes and the second electrodes of the insulated gate bipolar transistors can be the emitter electrodes.

The essential concept of the invention consists in connecting the abovementioned auxiliary electrode of the first switching transistor to the line (having an inductance) to the phase output rather than, as in accordance with the prior art, on the connecting line between the second electrode of the first switching transistor (emitter or source in the abovementioned examples) and the first electrode of the second switching transistor (i.e. collector or drain). As a result, the (line) inductance that is required for the inductive negative feedback in the case of a phase short circuit is always situated in the current path during normal operation and undergoes no rapid change in current. During normal operation, no temporal change in current intensity therefore takes place as a result of switching of the first switching transistor and thus no inductive negative feedback takes place. By contrast, in the case of a phase short circuit, the (line) inductance is located in the current path to be turned off, with the result that inductive negative feedback acts here when the switching transistor is turned off.

One particularly advantageous embodiment variant of the invention provides for the auxiliary electrode of the first switching transistor to be connected to the line to the phase output precisely at that distance from the second electrode of the first switching transistor at which the value of the inductance located in the connection path between the second electrode of the first switching transistor and the auxiliary electrode of the first switching transistor corresponds precisely to that value which is required for predetermined limitation of the turn-off speed of the first switching transistor by means of inductive negative feedback. A particularly discrete component therefore does not need to be provided. It suffices to select a favorable terminal point taking into account the line/leakage inductance of the phase output line connected to the second electrode.

According to the invention, provision is made for the line to the phase output to be connected essentially directly to the second electrode of the first switching transistor. This measure prevents leakage and/or line inductances from still being situated in the (normal operation) commutation circuit (as in accordance with the prior art).

According to the invention, provision is also made for the anode of the first diode to be directly connected to the auxiliary electrode of the first switching transistor. This measure makes it possible to further reduce the losses during normal operation.

BRIEF DESCRIPTION OF THE DRAWING

One exemplary embodiment of the invention is described in more detail below and is illustrated in the drawing, in which.

DESCRIPTION OF THE INVENTION

Figure 1:
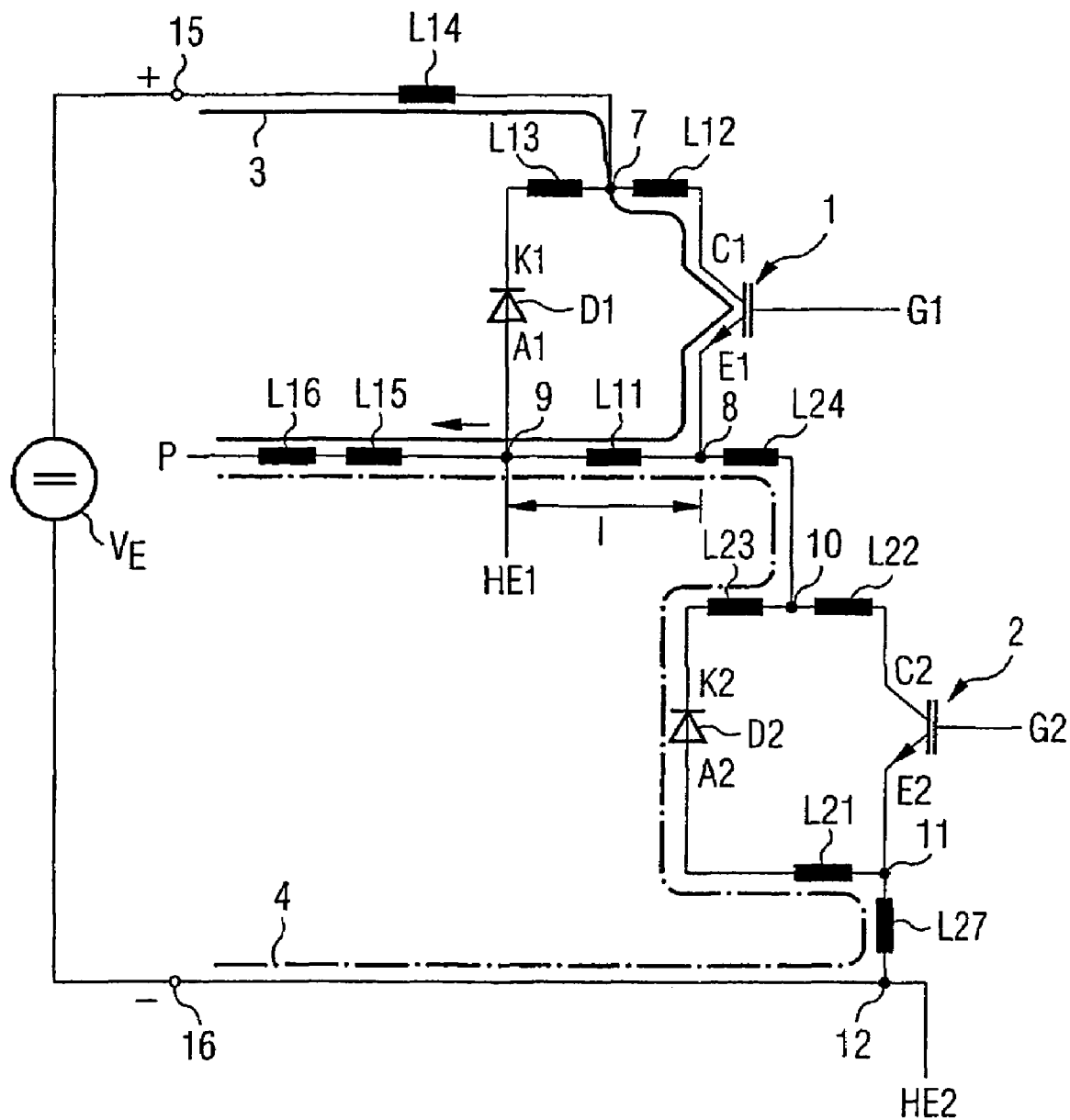
FIG. 1—shows an equivalent circuit diagram of a half-bridge circuit according to the invention having negative feedback that is effective in the event of a short circuit—normal operating state.
Figure 2:
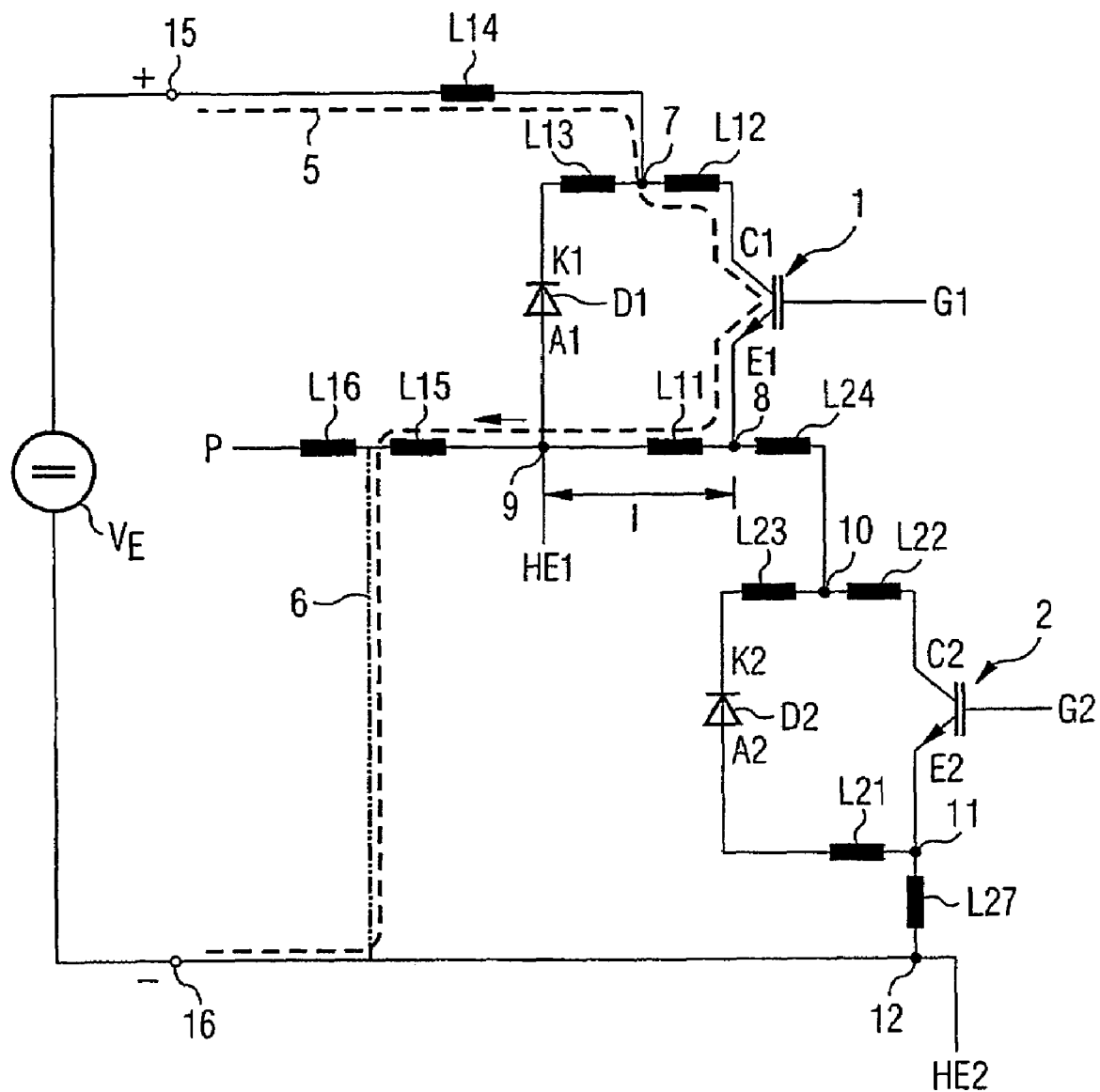
FIG. 2—shows an equivalent circuit diagram of the half-bridge circuit according to the invention having negative feedback that is effective in the event of a short circuit (as shown in FIG. 1) in the case of a short circuit between the phase output and an input branch.
Figure 3:
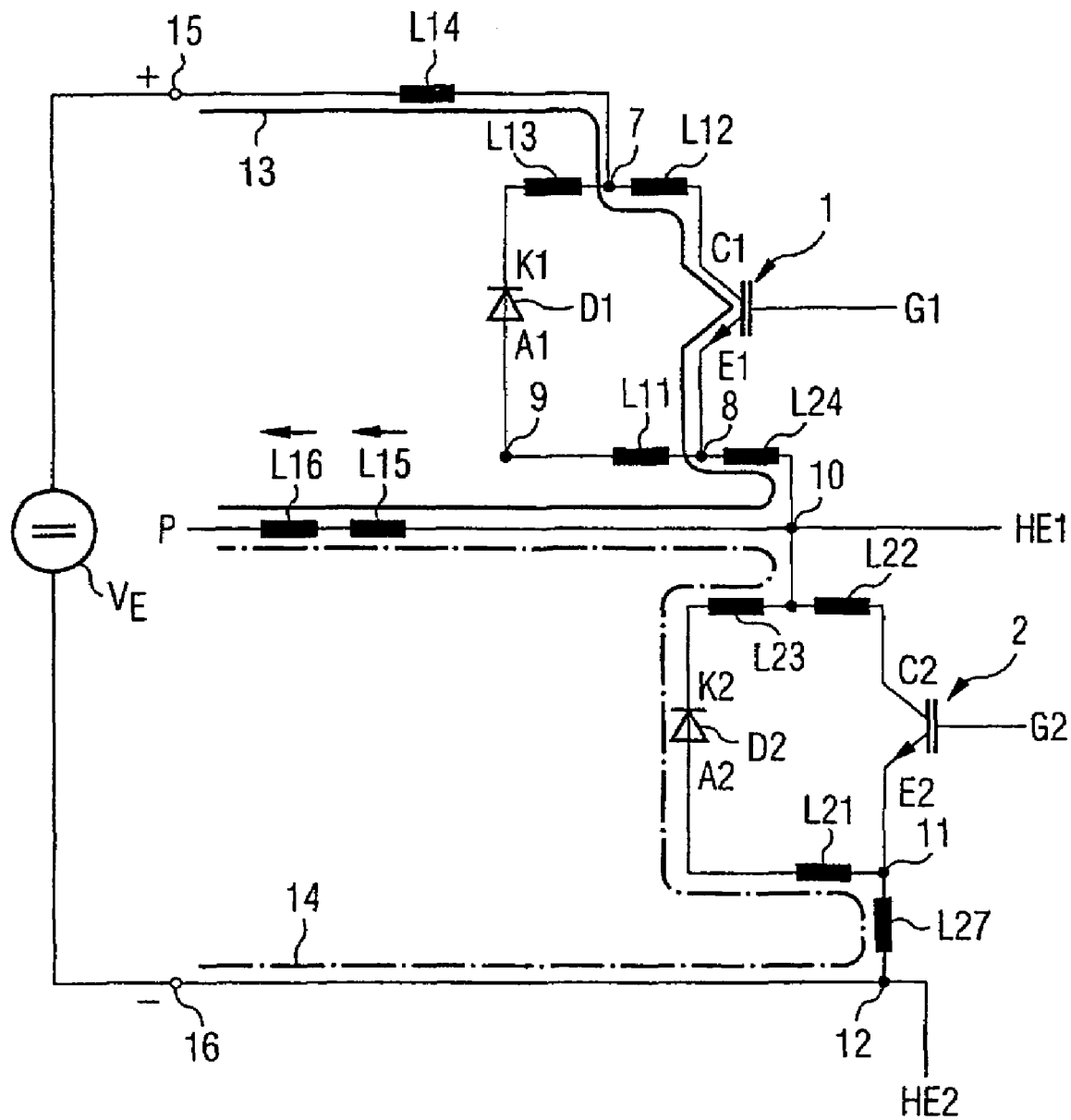
FIG. 3—shows an equivalent circuit diagram of a half-bridge circuit in accordance with the prior art—normal operating state.

FIGS. 1 and 2 show a modification according to the invention of the half-bridge circuit (in accordance with the prior art) that is illustrated in FIG. 3 and is described in detail above. The individual components of the half-bridge circuits that are identically present in all the FIGS. 1 to 3 of the drawing are illustrated, for the sake of easier understanding, in the form of circuit symbols which have been provided with the same reference symbols. As in FIG. 3 of the drawing, the leakage and line inductances that are present are also symbolized here by circuit symbols of discrete coils.

Accordingly, the half-bridge circuit that is shown in FIGS. 1 and 2 and is based on two insulated gate bipolar transistors and two diodes has two input terminals 15 and 16—via which an input DC voltage $V_E$ can be supplied—and a phase output P, at which an AC voltage can be tapped off.

The first input terminal 15 is connected to the node 7 via the (line/leakage) inductance L14. The node 7 is connected, on the one hand, to the collector C1 of the first insulated gate npn bipolar transistor 1 via the (line/leakage) inductance L12 and, on the other hand, to the cathode K1 of the first diode D1 via the (line/leakage) inductance L13. The emitter E1 of the first insulated gate npn bipolar transistor 1 is led to the node 8.

The node 8 is led, on the one hand, to the node 10 via the (leakage) inductance L24 and, on the other hand, the line to the phase output P is connected to the node 8. The line to the phase output P is symbolized by three series-connected discrete inductances L11, L15 and L16. The node 9 that is connected to the anode A1 of the first diode D1 is situated between the inductances L11 and L15.

This node 10 forms the terminal point for the second series-connected power/switching transistor (IGBT 2).

Taking into account line and/or leakage inductances, the node 10, according to the exemplary embodiment in accordance with the prior art, establishes a connection, on the one hand, to the collector terminal C2 of the second insulated gate npn bipolar transistor 2 via the (leakage) inductance L22 and, on the other hand, to the cathode K2 of the second diode D2 via the (line/leakage) inductance L23. The emitter E2 of the second insulated gate npn bipolar transistor 2 is led to the node 11. The anode A2 of the second diode D2 is likewise connected to the node 11 via the (line/leakage) inductance L21. A line that is represented by the inductance L27 in turn leads away from the node 11 to the node 12 and from there onward to the input terminal 16.

As in the exemplary embodiment in accordance with the prior art, the auxiliary emitter HE2 of the second insulated gate npn bipolar transistor 2 is situated at the node 12 that in turn establishes a connection to the input terminal 16.

By contrast, the auxiliary emitter HE1 of the first insulated gate bipolar transistor 1 is now no longer situated directly at the node 10 (as in the exemplary embodiment shown in FIG. 3) but rather at the node 9 in the line to the phase output P.

FIG. 1 shows a case of normal operation of the half-bridge circuit, the commutation of a DC voltage $V_E$ that is supplied on the input side. Accordingly, when the first insulated gate npn bipolar transistor 1 is turned on, a current is led along the current path (identified by the reference symbol 3 in FIG. 1 of the drawing) to the phase output P on account of the positive voltage + applied to the first input terminal 15: in accordance with FIG. 1, the current path 3 runs to the phase output P via the inductance L14, the node 7, the inductance L12, the collector-emitter path C1-E1 of the first insulated gate bipolar transistor 1, the node 8, the inductance L11, the node 9 and the inductances L15, L16.

When the first insulated gate npn bipolar transistor 1 is turned off, the current commutates to the current path identified by the reference symbol 4. Accordingly, when the first insulated gate npn bipolar transistor 1 is off, the negative pole − of the input voltage $V_E$ that is connected to the second input terminal 16 is connected to the phase output P via the node 12, the inductance L27, the node 11, the inductance L21, the diode D2 connected in the forward direction, the inductance L23, the node 10, the inductance L24, the node 8, the inductance L11, the node 9 and the inductances L15, L16. In this case, on account of Lenz's law, the current to the phase output P is maintained and a current flows along the current path 4.

During the normal commutation process, this inductance L11 is not situated between the terminal 15 and the node 8 in the current path 3 or between the terminal 16 and the node 8 in the current path 4, i.e. in parts of the abovementioned current paths 3 or 4 in which the current intensity changes quickly. Rather, this inductance L11 is situated in a line section comprising both current paths 3 and 4. The current intensity in the negative feedback inductance L11 does not change in this line section between the node 8 and the phase output P. Negative feedback that is associated with switching losses does not therefore take place here.

In the event (illustrated in FIG. 2) of a short circuit occurring between the line leading to the phase output P and the second input terminal 16, when the IGBT 1 is turned on, the positive pole + of the input DC voltage source $V_E$ is connected to the negative pole − of the input DC voltage source $V_E$ via the inductance L14, the node 7, the inductance L12, the collector emitter path C1-E1 of the IGBT 1, the inductance L11, the node 9, the inductance L15, the short-circuit path 6 and the input terminal 16. Current flows along the current path identified by the reference symbol 5.

In the case of interruptions in the line sections located in this current path, for example when the first insulated gate bipolar transistor 1 is turned off, the current intensity in the inductance L11 changes quickly. Desired negative feedback for limiting the turn-off speed of the first insulated gate npn bipolar transistor 1 takes place in this case.

It should be pointed out that the auxiliary emitter HE1 of the first insulated gate npn bipolar transistor 1 is connected to the line to the phase output P precisely at that distance 1 emitter E1 of the first insulated gate npn bipolar transistor 1 at which the value of the inductance L11 located in the connection path between the emitter E1 of the first insulated gate npn bipolar transistor 1 and of the auxiliary emitter HE1 of the first insulated gate npn bipolar transistor 1 corresponds precisely to that value which is required for predetermined limitation of the turn-off speed of the first insulated gate bipolar transistor 1 by means of inductive negative feedback.

The invention claimed is:

1. A half-bridge circuit, in which an input signal that is applied between two input terminals can be tapped off at a phase output, comprising:
   two switching transistors which can be driven via a respective drive signal that is applied between a control electrode and an auxiliary electrode, and
   two diodes, wherein
   the first input terminal being coupled with a first electrode of the first switching transistor and with a cathode of the first diode,
   a second electrode of the first switching transistor being connected via a first line to the anode of the first diode which is connected via a second line with the phase output, and being coupled with a first electrode of the second switching transistor and with a cathode of the second diode,
   a second electrode of the second switching transistor being coupled with an anode of the second diode and with the second input terminal, and wherein
   the auxiliary electrode is directly connected with the anode of the first diode at a node between the first and second line.

2. The half-bridge circuit as claimed in claim 1, wherein the first line has a length defined from the second electrode of the first switching transistor to the auxiliary electrode at which the value of its inductance corresponds precisely to a value which is required for predetermined limitation of the turn-off speed of the first switching transistor by means of inductive negative feedback.

3. The half-bridge circuit as claimed in claim 2, wherein the inductance is a line inductance and/or a leakage inductance.

4. The half-bridge circuit as claimed in claim 1, wherein the two switching transistors are insulated gate bipolar transistors.

5. The half-bridge circuit as claimed in claim 4, wherein the insulated gate bipolar transistors are of the npn type, and the first electrodes of the insulated gate bipolar transistors are the collector electrodes and the second electrodes of the insulated gate bipolar transistors are the emitter electrodes.

6. A half-bridge circuit comprising:
   a first and second input terminals and a phase output,
   a first diode comprising a cathode and an anode,
   a second diode comprising a cathode and an anode,
   a first switching transistor drivable through a control electrode and an auxiliary electrode which is coupled via a first line with the phase output, the first switching transistor comprising a first electrode coupled with the first input terminal and the cathode of the first diode, and a second electrode connected via a second line with the anode of the first diode which is directly connected via the first line to the phase output; and
   a second switching transistor comprising a first electrode coupled with the second electrode of the first switching transistor and with the cathode of the second diode, and a second electrode coupled with the anode of the second diode and with the second input terminal.

7. The half-bridge circuit as claimed in claim 6, wherein the second line comprises the value of an inductance located in the connection path between the second electrode of the first switching transistor and the auxiliary electrode of the first switching transistor that corresponds precisely to a value which is required for predetermined limitation of a turn-off speed of the first switching transistor by means of inductive negative feedback.

8. The half-bridge circuit as claimed in claim 7, wherein the inductance is a line inductance and/or a leakage inductance.

9. The half-bridge circuit as claimed in claim 6, wherein the first and second line are connected in series directly to the second electrode of the first switching transistor.

10. The half-bridge circuit as claimed in claim 6, wherein the two switching transistors are insulated gate bipolar transistors.

11. The half-bridge circuit as claimed in claim 10, wherein the insulated gate bipolar transistors are of the npn type, and the first electrodes of the insulated gate bipolar transistors are the collector electrodes and the second electrodes of the insulated gate bipolar transistors are the emitter electrodes.

* * * * *